United States Patent [19]
Hofer

[11] Patent Number: 4,563,652
[45] Date of Patent: Jan. 7, 1986

[54] DUAL-STAGE FILTER WITH FEEDBACK

[75] Inventor: Bruce E. Hofer, Beaverton, Oreg.

[73] Assignee: Audio Precision, Inc., Beaverton, Oreg.

[21] Appl. No.: 722,774

[22] Filed: Apr. 12, 1985

[51] Int. Cl.$^4$ ............................ H03F 1/34; H03F 3/68
[52] U.S. Cl. .................................... 330/107; 330/294; 330/310
[58] Field of Search ............... 330/107, 109, 293, 294, 330/295, 303, 306, 310, 311

[56] References Cited

U.S. PATENT DOCUMENTS 4,189,681  2/1980  Lawson et al. ................ 330/294 X
4,207,543  6/1980  Izakson et al. ................ 330/294 X

*Primary Examiner*—Eugene R. LaRoche
*Assistant Examiner*—Steven J. Mottola
*Attorney, Agent, or Firm*—Chernoff, Vilhauer, McClung, Birdwell & Stenzel

[57] ABSTRACT

A dual-stage band pass-band reject filter with feedback. Two state variable band pass filters with identical topology are cascaded as first and second stages. Each stage employs two inverting adders and two inverting integrators in a state variable topology, and each provides a band pass output and a band reject output. Both stages are selectively tuned to the same fundamental frequency. The filter output may be switched from a band pass to a band reject mode. In the band reject mode decreased attenuation of harmonics of the fundamental frequency is achieved by providing a predetermined amount of feedback from either the band reject output or band pass output of the second stage to the input of a respective one of the two adders of the first stage.

7 Claims, 5 Drawing Figures

DUAL-STAGE FILTER WITH FEEDBACK

BACKGROUND OF THE INVENTION

This invention relates to band pass-band reject filters, in particular to a dual stage filter with feedback characterized by exceptional rejection of the fundamental frequency and minimal attenuation of its harmonics.

In the design of audio frequency distortion analyzers it is desirable to employ a band-reject, or "notch", filter that selectively removes the fundamental frequency component of a signal, allowing the amplitude of the residue to be measured. The amplitude of the residue relative to the amplitude of the signal prior to rejection of the fundamental component is a measure of the harmonic distortion in the signal. Ideally, the notch filter would totally reject frequencies within a predetermined bandwidth of the fundamental frequency without attenuating harmonics thereof. Conventional approaches, allowing for the aforementioned predetermined bandwidth, have resulted in filters exhibiting 0.2 to 0.5 dB attenuation at the second harmonic of the fundamental frequency.

One generally acceptable prior art type of band reject filter is a state variable notch filter which also produces a band pass output. An example of such a filter is shown in FIG. 1 hereof. LaPlace formulations of equations expressing the transfer functions for such a filter are as follows:

$$\frac{V_{BR}}{V_{IN}} = -\left(\frac{R_2}{R_1}\right)\left[\frac{1 + \frac{S^2}{\omega^2}}{1 + \frac{S}{Q\omega} + \frac{S^2}{\omega^2}}\right] \quad \text{Equation 1}$$

$$\frac{V_{BP}}{V_{IN}} = -\left(\frac{R_3}{R_1}\right)\left[\frac{\frac{S}{Q\omega}}{1 + \frac{S}{Q\omega} + \frac{S^2}{\omega^2}}\right] \quad \text{Equation 2}$$

where $R_1$, $R_2$, and $R_3$ are the values of the resistors shown in FIG. 1, $\omega$ is the fundamental frequency of the filter, and Q is the quality factor of the filter. $\omega$ and Q are determined as follows:

$$\omega = \frac{1}{R_T C_T} \sqrt{\frac{R_6}{R_5}} \quad \text{Equation 3}$$

$$Q = \frac{R_3 R_4}{R_2 R_5} \sqrt{\frac{R_5}{R_6}} \quad \text{Equation 4}$$

where $R_2$, $R_3$, $R_4$, $R_5$ and $R_6$ are the values of respective resistors, $R_T$ is the value of both resistors $R_{T1}$ and $R_{T2}$, and $C_T$ is the value of both capacitors $C_{T1}$ and $C_{T2}$ shown in FIG. 1.

While such a circuit has useful applications, particularly since it provides both band reject and band pass outputs, it is inadequate as a notch filter in the measurement of extremely low levels of distortion, on the order of 0.001 percent, due to attenuation of harmonics of its fundamental frequency. This is so even where two such circuits are cascaded. Therefore, it would be desirable if an improved circuit were available that would allow exceptional rejection of a fundamental frequency in combination with minimal attenuation of its harmonics so as to permit measurements of distortion as low as 0.001 percent.

SUMMARY OF THE INVENTION

The present invention provides exceptional rejection of frequencies within a desired bandwidth of a selected fundamental frequency with minimal attenuation of its harmonics by employing a pair of cascaded state variable filters having a feedback path from either the band pass or band reject output of the second filter to a corresponding node in the first filter. The feedback path comprises a single current path of selected resistance. It has been found that the use of an appropriate resistance in such a feedback path narrows the top of the rejection band without significantly affecting the skirt width thereof.

The filter is constructed so as to be tunable, the capacitors and resistors in each stage which effect the fundamental frequency being simultaneously adjustable.

For flexibility of application of the filter, it may be selectively switched between a band reject and a band pass mode.

Accordingly, it is a principal objective of the present invention to provide a novel band passband reject filter.

It is another objective of the present invention to provide a band pass-band reject filter providing decreased attenuation of harmonics of the filter's fundamental rejection frequency.

It is yet another objective of the present invention to provide such a filter wherein the fundamental frequency thereof is tunable.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
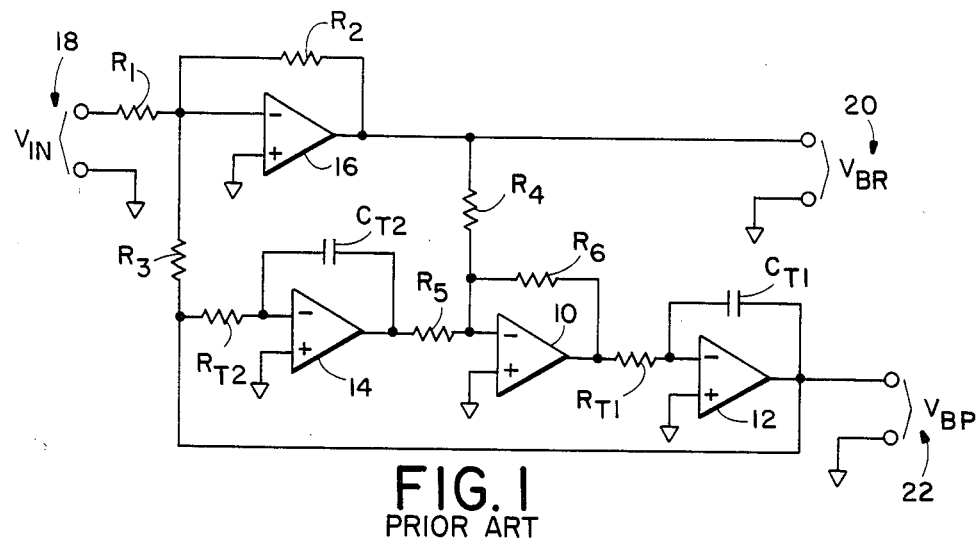
FIG. 1 is a schematic diagram of a representative example of a prior art state variable band pass-band reject filter.

A prior art state variable band pass-band reject filter is shown in FIG. 1. It employs a first operational amplifier 10 having a feedback resistor $R_6$ connected from its output to its inverting input, and input resistors $R_4$ and $R_5$, the non-inverting input being connected to common; it thus forms a first inverting adder. Another operational amplifier 12 has a feedback capacitor $C_{T1}$ connected from its output to its inverting input, and an input resistor $R_{T1}$ connected from the output of the operational amplifier 10 to the inverting input of operational amplifier 12, the non-inverting input of operational amplifier 12 being connected to common; it thus forms a first inverting integrator. A further operational amplifier 14 has a feedback capacitor $C_{T2}$ connected from its output to its inverting input and an input resistor $R_{T2}$ connected from its inverting input to the output of operational amplifier 12, the non-inverting input of operational amplifier 14 being connected to common; it thus forms a second inverting integrator. In this circuit $C_{T1}=C_{T2}$, which is represented by $C_T$ in Equation 3 referred to in the Background of the Invention. $R_{T1}=R_{T2}$, which is represented by $R_T$ in Equation 3 in the Background of the Invention.

Yet another operational amplifier 16 has a feedback resistor $R_2$ connected from its output to its inverting input, one input resistor $R_1$ being connected from its inverting input to the signal input 18 (to which the input voltage $V_{IN}$ is applied), and another input resistor $R_3$ connected from its inverting input to the output of operational amplifier 12. The non-inverting input is, like the other operational amplifiers, connected to common. Thus, operational amplifier 16, in connection with its input and feedback resistors, forms a second inverting adder.

The output of the second inverting adder is applied through $R_4$ as an input to the first inverting adder. It also supplies a band reject signal $V_{BR}$ at output 20; that is, $V_{BR}$ exhibits maximum attenuation at the fundamental frequency of the filter. The filter is also provided with a band pass output 22 represented by the voltage $V_{BP}$; that is, the output 22 exhibits maximum amplitude at the fundamental frequency of the filter.

By varying $C_{T1}$, $C_{T2}$, $R_{T1}$, and $R_{T2}$, and to a lesser degree $R_5$ and $R_6$, the fundamental frequency of the filter may be tuned. By varying $R_2$, $R_3$, $R_4$, $R_5$, and $R_6$ the Q of the circuit may be adjusted.

Figure 2:
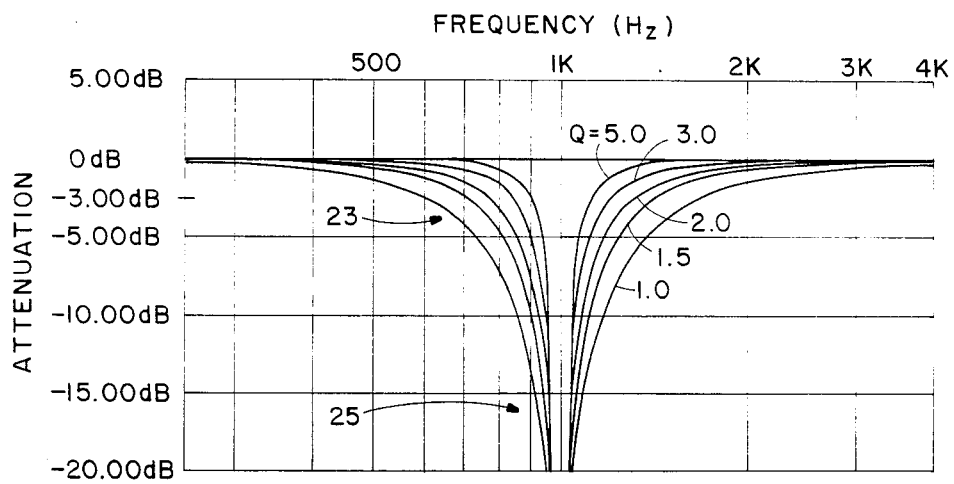
FIG. 2 is a family of curves showing the attenuation of a filter of the type shown in FIG. 1 as a function of frequency at various quality factors.

FIG. 2 shows the band reject characteristic of a representative filter constructed in accordance with FIG. 1. Each of the curves in the family of curves shown in FIG. 2 represents attenuation as a function of frequency for a selected Q, as shown in FIG. 2. The "top" of such curves is generally represented at 23, and the "skirt" is generally represented at 25. The width and the sharpness of the corners at the top of such curves is an indication of the harmonic attenuation. The width of the skirt is an indication of the rejection bandwidth. Although, as can be seen from FIG. 2, at higher Qs there is little attenuation at the harmonics of the fundamental frequency, the resultant skirt at a high amount of attenuation is too narrow for many practical applications.

Figure 3:
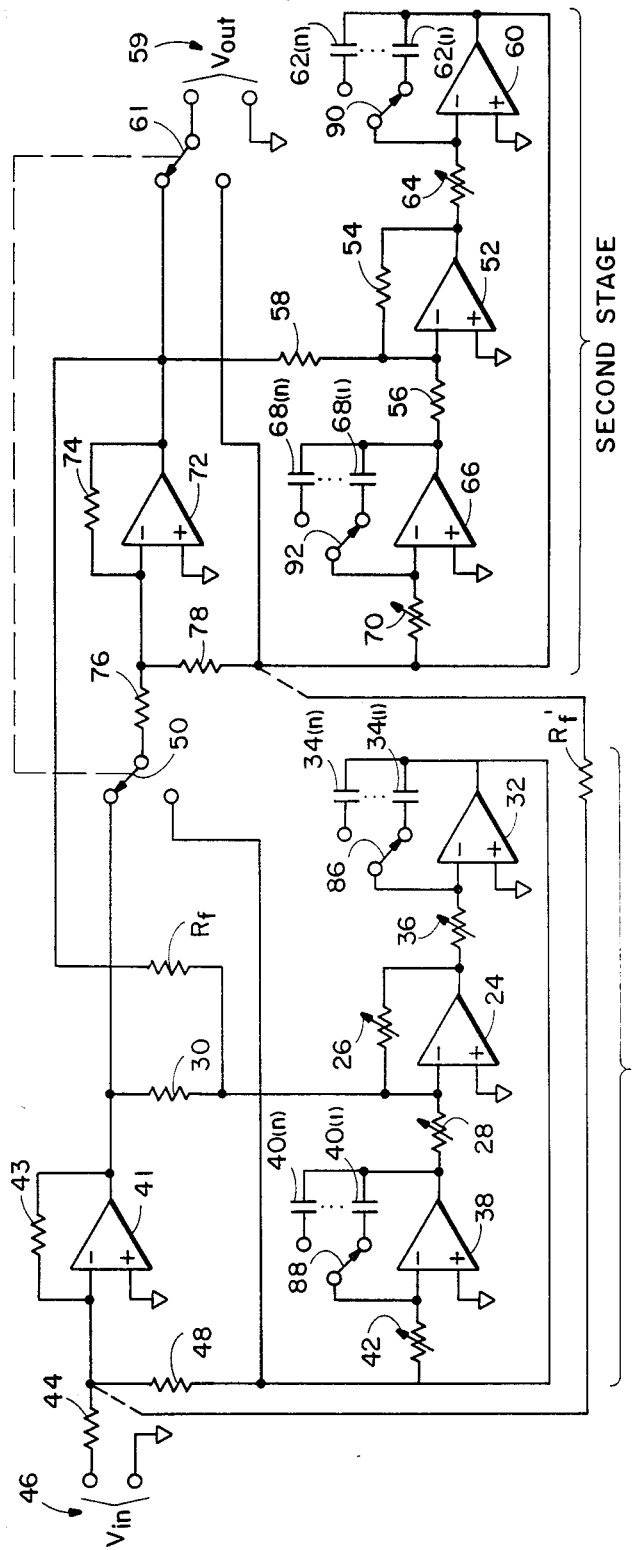
FIG. 3 is a schematic diagram of an embodiment of a filter according to the present invention.

Turning to FIG. 3, a filter according to the present invention employs two stages, each of which is similar to the filter shown in FIG. 1. However, the two stages are cascaded and a feedback path from an output of the second stage to a corresponding node in the first stage is provided. More specifically, the first stage employs a first operational amplifier 24 having a feedback resistor 26 connected from the output of the operational amplifier to its inverting input, and a first input resistor 28 and a second input resistor 30 also connected to its inverting input, its non-inverting input being connected to common; thus, it forms a first inverting adder. Operational amplifier 32 has a selected one of capacitors 34(1)–34(n) connected from its output to its inverting input and an input resistor 36 connected from its inverting input to the output of operational amplifier 24, its non-inverting input being connected to common; thus, it forms a first inverting integrator. Operational amplifier 38 has a selected one of a plurality of capacitors 40(1)–40(n) connected from its output to its inverting input and an input resistor 42 connected from its inverting input to the output of operational amplifier 32, its non-inverting input being connected to common; thus, it forms a second inverting integrator. Its output is connected to the inverting input of operational amplifier 24 through resistor 28.

Operational amplifier 41 has a feedback resistor 43 connected from its output to its inverting input, a first input resistor 44 connected from the signal input 46, represented by $V_{IN}$, to its inverting input, and a second input resistor 48 connected from its inverting input to the output of operational amplifier 32, which thus forms a second inverting adder. The output from operational amplifier 41 provides a band reject signal $V_{BR}$ which is also applied to the first inverting adder through resistor 30. The output from operational amplifier 32 provides a band pass signal $V_{BP}$. Switch 50 enables the input to the second stage to be selected from between the band reject and band pass outputs of the first stage.

As can be seen from FIG. 3 the second stage is identical in topology to the first stage. A third inverting adder is formed by operational amplifier 52, feedback resistor 54, and input resistors 56 and 58. A third inverting integrator is formed by operational amplifier 60, feedback capacitors 62(1)–62(n), and input resistor 64. A fourth inverting integrator is formed by operational amplifier 66, feedback capacitors 68(1)–68(n), and input resistor 70. A fourth inverting adder is formed by operational amplifier 72, feedback resistor 74, and input resistors 76 and 78, the output from this fourth inverting adder being applied through resistor 58 as an input to the third inverting adder. The output 59 of the filter, represented by $V_{out}$, may be selected between band reject and band pass modes by switch 61, the output of the third inverting integrator providing a band pass output, switches 61 and 50 being ganged together for the same purpose.

Figure 4:
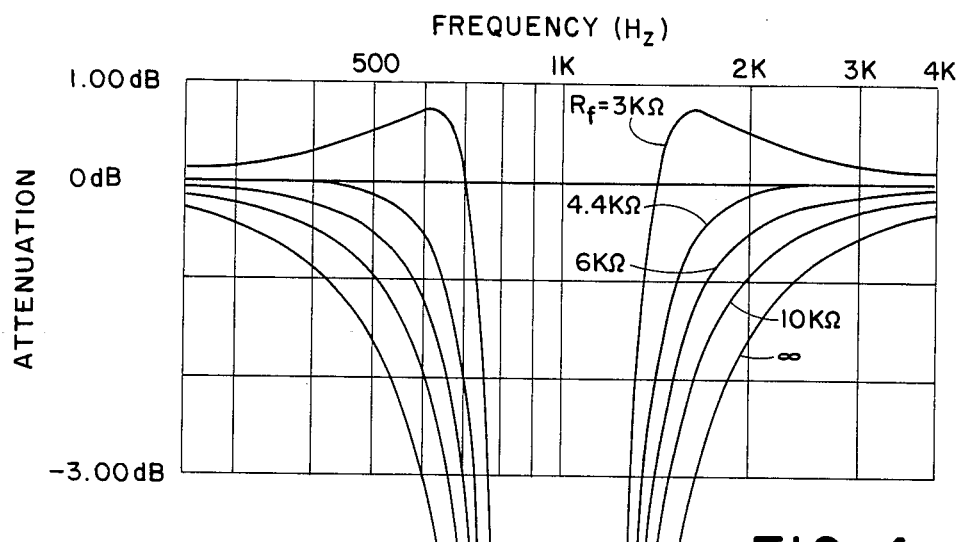
FIG. 4 is a family of curves showing attenuation as a function of frequency for various feedback resistances in the embodiment shown in FIG. 3.

The key to the improvement provided by this filter of the present invention is in the feedback resistor $R_f$ shown connected between the output of the fourth inverting amplifier, that is the band reject output of the second stage, and the inverting input of operational amplifier 24, that is, the input of the first inverting adder, hereinafter referred to as the first stage node corresponding to the second stage band reject output. For a filter circuit whose component values (other than $R_f$) are those shown in Table 1, the effect of various choices for $R_f$ is shown in FIG. 4. As can be seen from FIG. 4, the attenuation of the second harmonic of a filter tuned to a fundamental frequency of 1 kHz where no feedback path is employed, that is, $R_f = \infty$, is approximately $-1.6$ dB. However, with $R_f =$ to 4.4 k ohms, the attenuation of the second harmonic is only about $-0.1$ dB. It can also be seen that with too much feedback, as where $R_f = 3$ k ohms, undesirable peaking occurs at the corners of the attenuation curve. Thus, the object is to chose a feedback resistor $R_f$ which provides a nearly monotonic response without peaking at the corners. In the example shown a value of about 4.4 k ohms is preferred. In general, however, while the circuit is subject to analytic treatment the equations are complex, and it has been found that an empirical analysis employing commonly known computer modeling techniques is the most effective way to ascertain the most desirable circuit components.

TABLE 1

| Component | Value |
|---|---|
| Resistor 26 | 2.10k ohms (nominal) |
| Resistor 28 | 1.50k ohms (nominal) |
| Resistor 30 | 4.02k ohms |
| Resistor 43 | 2.00k ohms |
| Resistor 44 | 2.00k ohms |
| Resistor 48 | 2.00k ohms |
| Resistor 54 | 1.40k ohms |
| Resistor 56 | 1.00k ohms |
| Resistor 58 | 1.24k ohms |
| Resistor 74 | 1.00k ohms |
| Resistor 76 | 1.00k ohms |
| Resistor 78 | 1.00k ohms |
| Resistors 36, 42, 64, and 70 | 2.5k ohms–25k ohms (variable) |
| Capacitors 34(1)–(n), 40(1)–(n), 62(1)–(n), and 68(1)–(n) | 330 pF, 3300 pF, 0.033 μF, or 0.33 μF |
| Resistor $R_f$ | 4.42k ohms |

Figure 5:
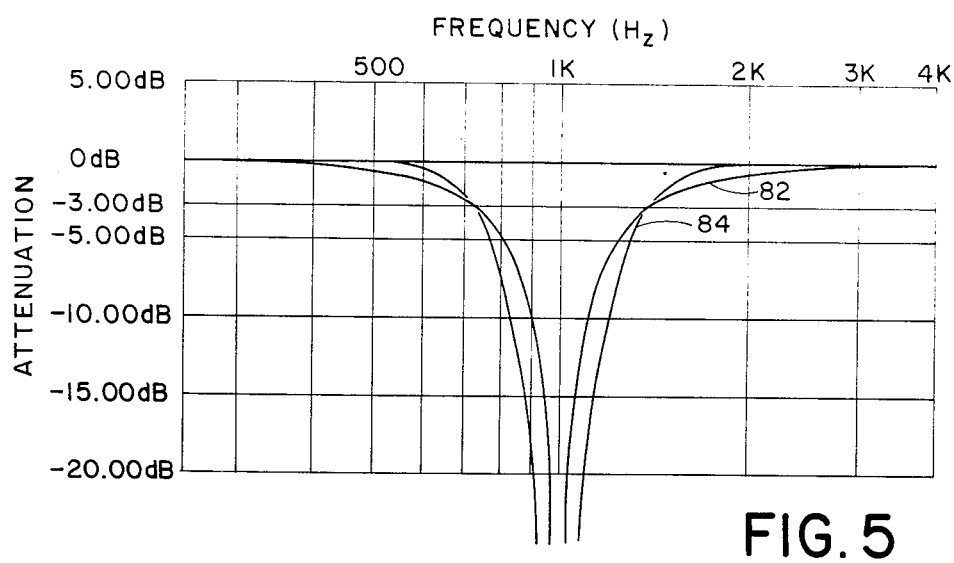
FIG. 5 is a set of curves showing attenuation as a function of frequency for a prior art single stage filter and for the filter of the embodiment shown in FIG. 3, where the filters have approximately the same quality factor.

As can be seen from FIG. 5, wherein curve 82 illustrates the attenuation of a single stage prior art state variable filter and curve 84 illustrates the attenuation of the preferred embodiment of the filter of the present invention, the effect of the invention is to sharpen the upper corners of the attenuation curve and significantly widen the skirt at high amounts of attenuation.

The center frequency of the filter is tuned by selecting the appropriate tuning capacitors 34(1)–34(n), 40(1)–40(n), 62(1)–62(n), and 68(1)–68(n). These are selected by respective switches 86, 88, 90, and 92. Preferably, the same value of capacitance is used for each of these integrators, and the switches 86–92 are ganged together so as to operate synchronously. The filter is also tuned by varying the resistance of tuning resistors 36, 42, 64, and 70, which are also preferably maintained the same, the resistances being provided by variable resistors ganged together so as to operate synchronously. Where all of the selected tuning capacitors have the same capacitance, and where all of the tuning resistors are adjusted to the same resistance, the fundamental frequency may be computed in accordance with Equation 3, the selected capacitance being $C_T$ and the adjusted resistance being $R_T$.

The circuit may also be fine tuned by adjusting resistors 26 and 28, with minimal effect on the Q of the circuit. Although the foregoing relationships between the resistance and capacitance values are preferable, it is to be understood that other relationships could be used without departing from the principles of this invention.

Alternatively, a result very nearly the same can be accomplished by providing the feedback from the band pass output of the second stage through a resistor $R_f'$ to the inverting input of operational amplifier 41, that is, as an input to the second inverting adder. This is referred to hereinafter as the first stage node corresponding to the second stage band pass output. While this feedback path may be used to advantage under some circumstances, the band reject feedback path is preferred because of the noise filtering effect of integrator stages occurring after the first stage node corresponding to the second stage band reject output.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A dual-stage filter, comprising:
   (a) a first stage comprising a first inverting adder having an input and an output, a first inverting integrator having an input and an output, the output of said first inverting adder being connected to the input of said first inverting integrator, a second inverting integrator having an input and an output, the output of said first inverting integrator being connected to the input of said second inverting integrator and providing a first stage band pass output, and the output of said second inverting integrator being connected to the input of said first inverting adder, and a second inverting adder having an input and an output, the input of said second inverting adder being connected to the output of said first inverting integrator and being adapted for receiving a filter input signal, and the output of said second inverting adder being connected to the input of said first inverting adder and providing a first stage band reject output;
   (b) a second stage comprising a third inverting adder having an input and an output, a third inverting integrator having an input and an output, the output of said third inverting adder being connected to the input of said third inverting integrator, a fourth inverting integrator having an input and an output, the output of said third inverting integrator being connected to the input of said fourth inverting integrator and providing a band pass filter signal output, and the output of said fourth inverting integrator being connected to the input of said third inverting adder, and a fourth inverting adder having an input and an output, the input of said fourth inverting adder being connected to the output of said third inverting integrator and to a selected output of said first stage, and the output of said fourth inverting adder being connected to the input of said third inverting adder and providing a band reject filter signal output; and
   (c) feedback means connected between a selected one of said band pass and band reject filter signal outputs and its corresponding node in said first stage for providing a predetermined portion of the signal at said selected output to said corresponding node.

2. The filter of claim 1 wherein said selected filter signal output is the band reject filter signal output.

3. The filter of claim 1 wherein said selected filter signal output is the band pass filter signal output.

4. The filter of claim 1 wherein each said integrator comprises an operational amplifier having an output and an inverting input, a capacitor connected between said output and said inverting input, and a resistor connected at one end to said inverting input, the other end of the resistor providing the input to said integrator, each said capacitor having the same capacitance and each said resistor having the same resistance.

5. The filter of claim 4, including first tuning means for varying the capacitance of each said capacitor simultaneously and second tuning means for varying the resistance of each said resistor simultaneously.

6. The filter of claim 1 wherein said first adder comprises an operational amplifier having an output and an inverting input, a feedback resistor connected from said output to said inverting input, and an input resistor connected at one end to said inverting input, the other end being connected to the output of said second integrator, said filter further including means for varying the resistance of said feedback resistor of said first adder and means for varying the resistance of said input resistor of said first adder.

7. The filter of claim 1, further comprising means for selectively connecting, simultaneously, the input of said second stage to either said band reject or said band pass output of said first stage, and the output of said filter to said band reject or said band pass output of said second stage.

* * * * *